United States Patent
Moon et al.

(10) Patent No.: US 9,837,138 B1
(45) Date of Patent: Dec. 5, 2017

(54) SEMICONDUCTOR DEVICE

(71) Applicant: SK hynix Inc., Icheon-si, Gyeonggi-do (KR)

(72) Inventors: Hong Ki Moon, Seoul (KR); Jeong Tae Hwang, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 15/438,411

(22) Filed: Feb. 21, 2017

(30) Foreign Application Priority Data

Jul. 27, 2016 (KR) .......................... 10-2016-0095506

(51) Int. Cl.
*G11C 7/00* (2006.01)
*G11C 11/406* (2006.01)
*G11C 11/4093* (2006.01)

(52) U.S. Cl.
CPC .... *G11C 11/40615* (2013.01); *G11C 11/4093* (2013.01)

(58) Field of Classification Search
CPC ............ G11C 11/406; G11C 11/40615; G11C 11/40618; G11C 2211/4067
USPC ................................................ 365/222, 233.1
See application file for complete search history.

(56) References Cited

U.S. PATENT DOCUMENTS

| | | |
|---|---|---|
| 2010/0278000 A1 | 11/2010 | Bhakta et al. |
| 2011/0156768 A1 | 6/2011 | Lee |
| 2012/0127817 A1* | 5/2012 | Fujishiro ............... G11C 11/406 365/222 |
| 2014/0003178 A1* | 1/2014 | Song ..................... G11C 11/402 365/222 |

* cited by examiner

*Primary Examiner* — Son Dinh
(74) *Attorney, Agent, or Firm* — William Park & Associates Ltd.

(57) ABSTRACT

A semiconductor device may be provided. The semiconductor device may include an input signal generator configured to enable an input signal although a reset signal is disabled after a clock enable signal is enabled. The semiconductor device may include a self-refresh enable signal generator configured to generate a self-refresh enable signal based on the input signal.

20 Claims, 12 Drawing Sheets

SEMICONDUCTOR DEVICE

CROSS-REFERENCE TO RELATED APPLICATION

This application claims priority based upon Korean patent application No. 10-2016-0095506, filed on Jul. 27, 2016, the disclosure of which is hereby incorporated in its entirety by reference herein.

BACKGROUND

1. Technical Field

Embodiments of the present disclosure may generally relate to a semiconductor device and system, and more particularly to a refresh.

2. Related Art

In a semiconductor device, a capacitor is used to store date within a memory cell. Therefore, if a specific word line is selected, a transistor connected to the specific word line is turned on, such that a potential of the cell corresponding to the above word line is output to a bit line.

The potential of the memory cell is gradually reduced. In other words, a capacitor used for a memory cell of the semiconductor device gradually discharges electric charges stored therein over time, such that data is lost. Thus, the capacitor is unsuitable for memory devices used to read and write data. Therefore, to guarantee the reliability of all the devices designed to use the semiconductor device must perform the refresh operations to recover electric charges of the memory cells.

Capacitance of the capacitor gradually increases in proportion to the increasing size (region) of the capacitor, such that the time required for discharging the electric charges from the capacitor increases. The size of a capacitor according to the related art is deemed sufficiently large when the electric charges stored in memory cells are not easily discharged and thus data reliability can be guaranteed.

However, as the technology becomes super-miniaturized, the size of each memory cell is gradually reduced, such that it may be impossible to guarantee data reliability. That is, as the size of a capacitor is gradually reduced, the capacitor stores less data, such that the capacitor is more rapidly discharged compared to the related art, thus, resulting in the reduction of data reliability.

Additionally, a semiconductor device may be configured to receive a reset signal to initialize an internal signal thereof. However, if the above-mentioned refresh operation is not performed when the reset signal is applied to the semiconductor device, data stored in the memory cell may be discharged.

SUMMARY

In accordance with an embodiment of the present disclosure, a semiconductor device may be provided. The semiconductor device may include an input signal generator configured to enable an input signal although a reset signal is disabled after a clock enable signal is enabled. The semiconductor device may include a self-refresh enable signal generator configured to generate a self-refresh enable signal based on the input signal.

In accordance with an embodiment of the present disclosure, a semiconductor device may include an input signal generator configured to enable an input signal based on an enabled duration of a reset signal being a predetermined time or longer. The semiconductor device may include a self-refresh enable signal generator configured to generate a self-refresh enable signal based on the input signal.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a semiconductor device that substantially obviates one or more problems due to limitations and disadvantages of the related art.

An embodiment of the present disclosure may relate to a refresh control circuit for performing the refresh operation even when a reset signal is enabled, to reduce the loss or damage of data stored in memory cells.

Figure 1:
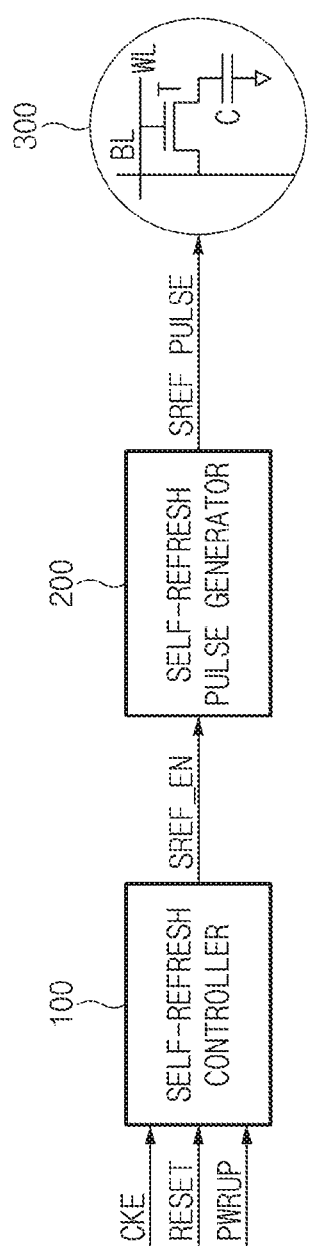
FIG. 1 is a schematic diagram illustrating a representation of an example of a semiconductor device according to an embodiment of the present disclosure.

FIG. 1 is a schematic diagram illustrating a representation of an example of a semiconductor device according to an embodiment of the present disclosure.

Referring to FIG. 1, the semiconductor device according to an embodiment of the present disclosure may include a self-refresh controller 100, a self-refresh pulse generator 200, and a memory cell 300.

The self-refresh controller 100 may receive a clock enable signal (CKE), a reset signal (RESET), and a power-up signal (PWRUP), and may generate a self-refresh enable signal (SREF_EN).

The self-refresh pulse generator 200 may generate a self-refresh pulse (SREF pulse) in response to the self-refresh enable signal (SREF_EN) generated by the self-refresh controller 100.

For example, the self-refresh pulse generator 200 may generate the self-refresh pulse (SREF pulse) at intervals of a predetermined time when the self-refresh enable signal (SREF_EN) is enabled. In this case, the period of the self-refresh pulse (SREF pulse) may be changed according to temperature.

The memory cell 300 may include a capacitor C and a transistor T connected to the capacitor C. The transistor T may be coupled to a word line (WL) and a bit line (BL).

By the above-mentioned structure, the word line (WL) and the bit line (BL) are controlled according to the self-refresh pulse (SREF pulse), such that the self-refresh operation is carried out.

Figure 2:
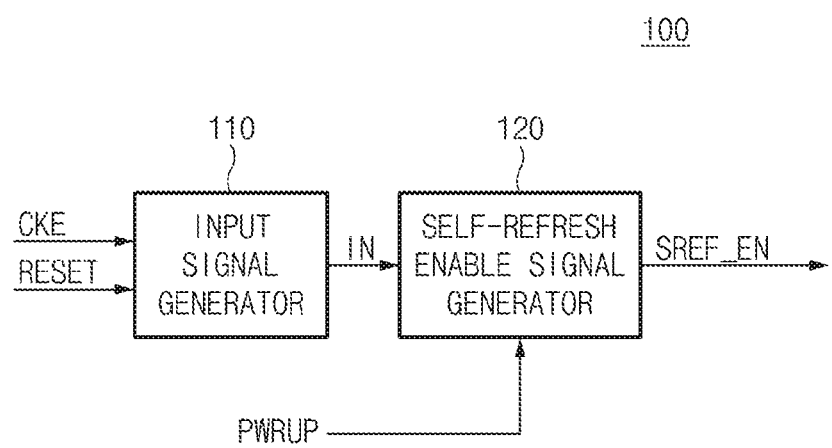
FIG. 2 is a circuit diagram illustrating a representation of an example of a self-refresh controller illustrated in FIG. 1 according to an embodiment of the present disclosure.

FIG. 2 is a circuit diagram illustrating a representation of an example of the self-refresh controller 100 illustrated in FIG. 1.

Referring to FIG. 2, the self-refresh controller 100 may include an input signal generator 110 and a self-refresh enable signal generator 120.

The input signal generator 110 may generate an input signal (IN) on the basis of the clock enable signal (CKE) and the reset signal (RESET).

The self-refresh enable signal generator 120 may generate the self-refresh enable signal (SREF_EN) on the basis of not only the input signal (IN) generated by the input signal generator 110 but also the power-up signal (PWRUP).

Figure 3:
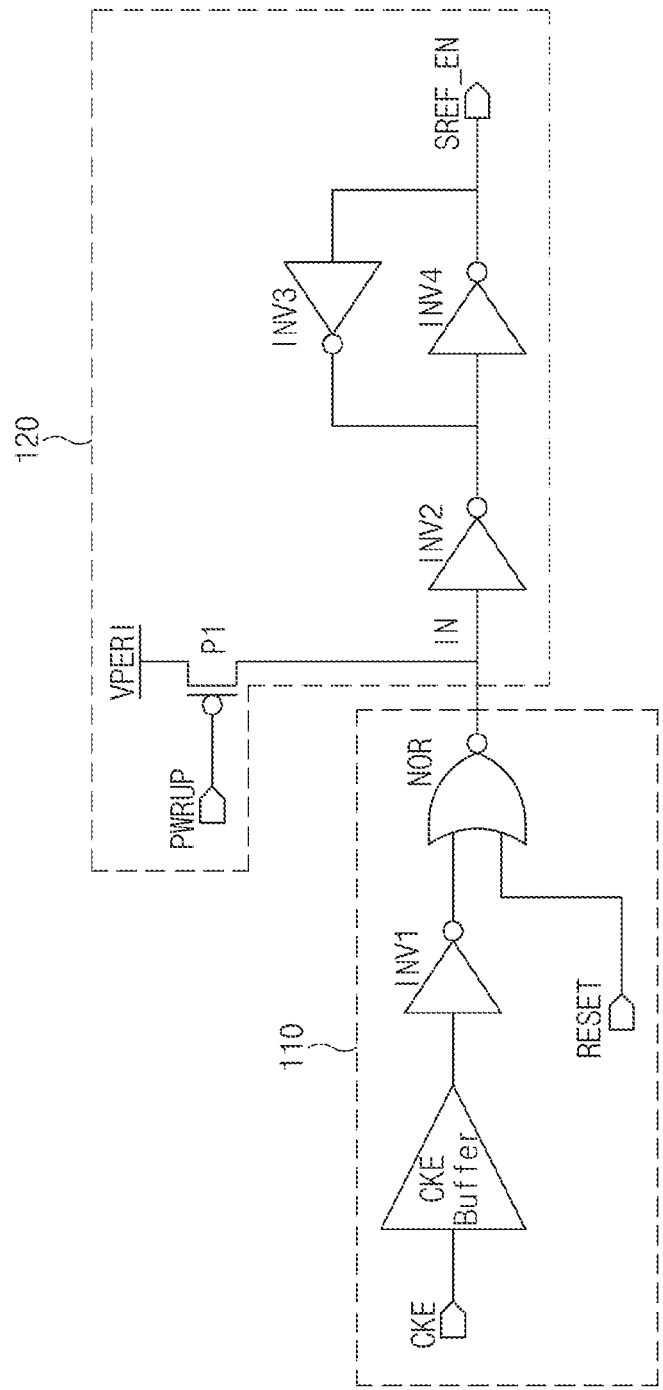
FIG. 3 is a circuit diagram illustrating a representation of an example of an input signal generator and a self-refresh enable signal generator illustrated in FIG. 2.

FIG. 3 is a circuit diagram illustrating a representation of an example of the input signal generator 110 and the self-refresh enable signal generator 120 illustrated in FIG. 2.

Referring to FIG. 3, the input signal generator 110 may include a buffer, an inverter (INV1), and a NOR operator (NOR1).

The clock enable signal (CKE) may be inverted by the inverter (INV1) after passing through the buffer (CKE Buffer), and may be input to the NOR operator (NOR1). The NOR operator (NOR1) may generate the input signal (IN) by performing a NOR operation between the inverted clock enable signal (CKE) and the reset signal (RESET). The input signal (IN) may be input to the self-refresh enable signal generator 120.

The self-refresh enable signal generator 120 may allow an inverter (INV2) to invert the input signal (IN) generated by the input signal generator 110. The inverted input signal (IN) may be output as the self-refresh enable signal (SREF_EN) after passing through a latch composed of inverters (INV3, INV4).

PMOS transistor P1 may be coupled to an input terminal of the self-refresh enable signal generator 120. A power-up signal (PWRUP) may be input to a gate terminal of the PMOS transistor P1, and a peripheral voltage (VPERI) may be input to a source terminal of the PMOS transistor P1.

If the power-up signal (PWRUP) is enabled to a high level, the PMOS transistor P1 is turned off. Accordingly, the self-refresh enable signal generator 120 may generate the self-refresh enable signal (SREF_EN) on the basis of the input signal (IN).

If the power-up signal (PWRUP) is disabled to a low level, the PMOS transistor P1 is turned on. Therefore, the peripheral voltage (VPERI) may be applied to the input signal (IN), and the self-refresh enable signal (SREF_EN) may be disabled to a low level.

That is, only when the power-up signal (PWRUP) is enabled, the self-refresh enable signal generator 120 may generate the self-refresh enable signal (SREF_EN) on the basis of the input signal (IN).

By the above-mentioned structure, although the reset signal (RESET) is enabled to a high level, assuming that the clock enable signal is enabled, the self-refresh enable signal is enabled. Accordingly, the self-refresh operation is not performed after the reset signal (RESET) is enabled, such that loss of data stored in the memory cell can be prevented.

For convenience of description, some embodiments of the present disclosure assume that the clock enable signal is enabled to a low level. However, the clock enable signal may be enabled to a high level. If necessary, the embodiments may not include the inverter (INV1).

In addition, the embodiments have disclosed, for example, that the peripheral voltage (VPERI) is applied to the PMOS transistor P1. However, the scope or spirit of the embodiments of the present disclosure are not limited thereto, and another voltage may also be applied to the PMOS transistor P1 as necessary.

In addition, although the embodiments include, for example, the NOR operator for convenience of description, the scope or spirit of the embodiments are not limited thereto, and the embodimens may include an OR operator instead of the NOR operator as necessary. In this case, the input signal may have an inversion level of the above-mentioned example.

Figure 4:
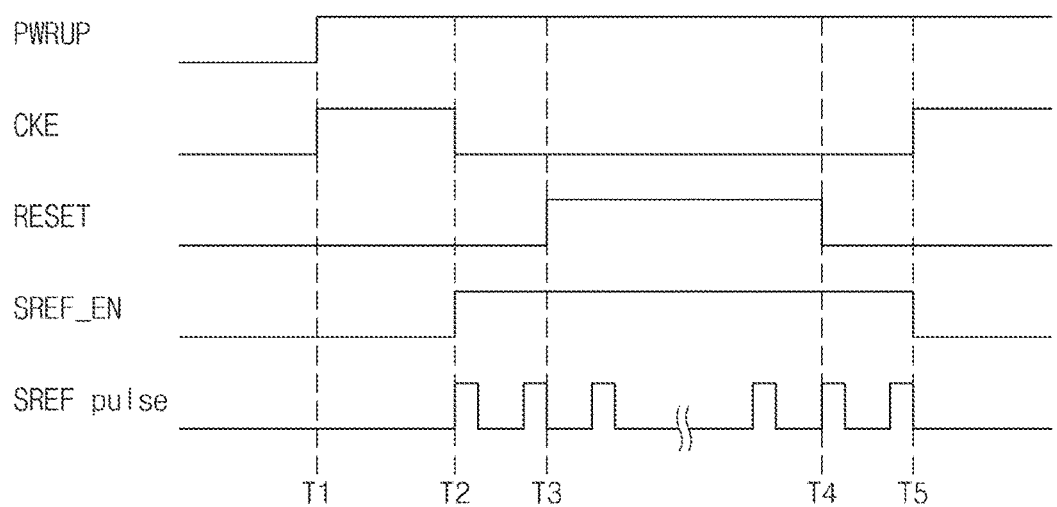
FIG. 4 is a timing diagram illustrating representations of examples of respective signals of the semiconductor device illustrated in FIG. 1.

FIG. 4 is a timing diagram illustrating representations of examples of respective signals of the semiconductor device illustrated in FIG. 1.

Referring to FIG. 4, the power-up signal (PWRUP) may be enabled at a time point T1. The clock enable signal (CKE) may be enabled to a low level at a time point T2 elapsed from the time point T1 by a predetermined time. In this case, the reset signal (RESET) may be disabled to a low level.

Therefore, at the time point T2, the self-refresh enable signal (SREF_EN) may be enabled to a high level and the pulse signal (SREF pulse) may be generated.

At a time point T3, the reset signal (RESET) may be enabled to a high level. However, according to one embodiment, if the clock enable signal (CKE) is enabled even though the reset signal (RESET) is enabled, the self-refresh enable signal (SREF_EN) may remain enabled. Therefore, although the reset signal (RESET) is enabled during a time section (T3~T4), the self-refresh enable signal (SREF_EN) may remain enabled.

If the clock enable signal (CKE) is disabled to a high level at a time point T5, the self-refresh enable signal (SREF_EN) may also be disabled, and the self-refresh pulse signal (SREF pulse) may not be generated.

Various other embodiments of the present disclosure will hereinafter be described with reference to FIGS. 5 and 6.

Figure 5:
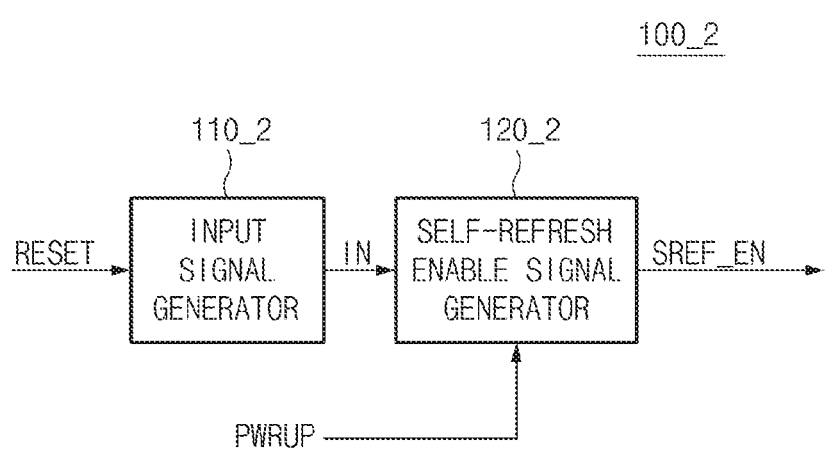
FIG. 5 is a circuit diagram illustrating a representation of an example of a self-refresh controller illustrated in FIG. 1 according to an embodiment of the present disclosure.

FIG. 5 is a circuit diagram illustrating a representation of an example of a self-refresh controller (100_2) illustrated in FIG. 1 according to an embodiment of the present disclosure.

Referring to FIG. 5, the self-refresh controller 100_2 may include an input signal generator (110_2) and a self-refresh enable signal generator (120_2).

The input signal generator (110_2) according to an embodiment may generate the input signal (IN) on the basis of the reset signal (RESET), differently from the input signal generator 110 of FIG. 2 in which the input signal (IN) is generated on the basis of the clock enable signal (CKE) and the reset signal (RESET).

The self-refresh enable signal generator (120_2) according to an embodiment may generate the self-refresh enable signal (SREF_EN) on the basis of the input signal (IN) when the power-up signal (PWRUP) is enabled, in the same manner as in the self-refresh enable signal generator 120 of FIG. 2.

Figure 6:
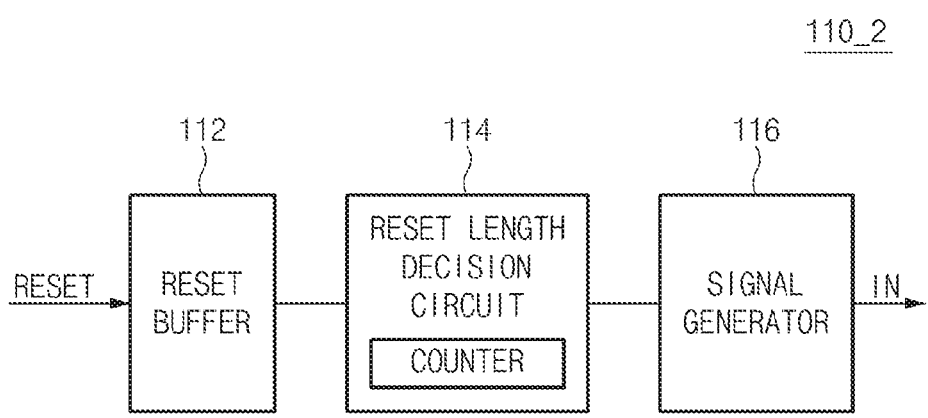
FIG. 6 is a circuit diagram illustrating a representation of an example of an input signal generator illustrated in FIG. 5.

FIG. 6 is a circuit diagram illustrating a representation of an example of the input signal generator (110_2) illustrated in FIG. 5 according to an embodiment of the present disclosure.

Referring to FIG. 6, the input signal generator (110_2) according to an embodiment may include a reset buffer 112, a reset length decision circuit 114, and a signal generator 116.

The reset buffer 112 may buffer the received reset signal (RESET), and may provide the buffered signal to the reset length decision circuit 114.

The reset length decision circuit 114 may determine whether the length of the reset signal (RESET) supplied from the reset buffer 112 is a predetermined value or higher. That is, the reset length decision circuit 114 may determine whether an enabled section of the reset signal (RESET) is equal to or longer than a predetermined time. The reset length decision circuit 114 may include a counter to measure the length of the reset signal (RESET).

If the reset length decision circuit 114 determines that the length of the reset signal (RESET) is equal to or longer than a predetermined value, the signal generator 116 may generate the input signal (IN).

Figure 7:
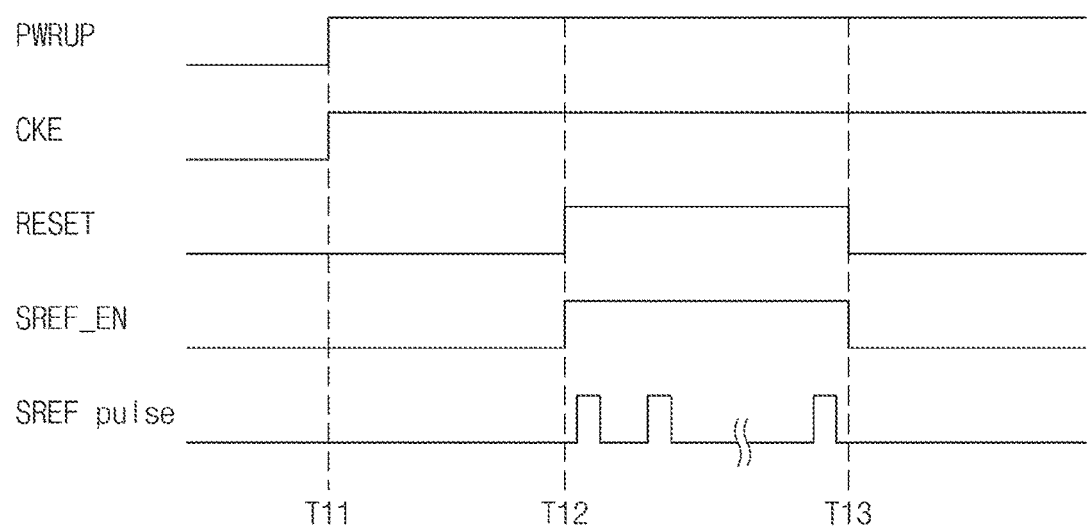
FIG. 7 is a timing diagram illustrating representations of examples of respective signals of the semiconductor device (see FIG. 1) having the self-refresh controller illustrated in FIG. 5.

FIG. 7 is a timing diagram illustrating representations of examples of respective signals of the semiconductor device illustrated in FIG. 1 according to an embodiment of the present disclosure.

Referring to FIG. 7, the power-up signal (PWRUP) may be enabled to a high level at a time point T11. The clock enable signal (CKE) may be disabled to a high level at the time point T11.

The reset signal (RESET) may be enabled to a high level during a time section (T12~T13). In this case, it is assumed that the length of the time section (T12~T13) is longer than a predetermined time established in the reset length decision circuit 114 of FIG. 6.

Therefore, the reset length decision circuit 114 of FIG. 6 may determine that the length of the reset signal (RESET) is equal to or longer than a predetermined value, and the signal generator 116 may enable or activate the input signal (IN). Thus, the self-refresh enable signal generator (120_2) of FIG. 5 may enable the self-refresh enable signal (SREF_EN).

Since the self-refresh enable signal (SREF_EN) is enabled, the self-refresh pulse generator 200 of FIG. 1 may generate the self-refresh pulse (SREF pulse).

In accordance with these embodiments, irrespective of the clock enable signal (CKE), the self-refresh enable signal (SREF_EN) may be generated by the reset signal (RESET) only. Therefore, when the reset signal (RESET) is input during a very long time (e.g., several tens of milliseconds (ms) or several hundreds of milliseconds (ms)), the self-refresh operation is automatically performed, such that loss of data stored in the memory cell can be prevented.

As can be seen from FIG. 7, the reset signal (RESET) and the self-refresh enable signal (SREF_EN) may be enabled during the same time section (T12~T13). However, the scope or spirit of the present disclosure is not limited thereto, and the reset signal (RESET) is buffered and the reset length is determined as illustrated in FIG. 6, such that the self-refresh enable signal (SREF_EN) may be delayed more than the reset signal (RESET) by a predetermined time and may then be enabled.

Various other embodiments of the present disclosure will hereinafter be described with reference to FIGS. 8 to 10.

Figure 8:
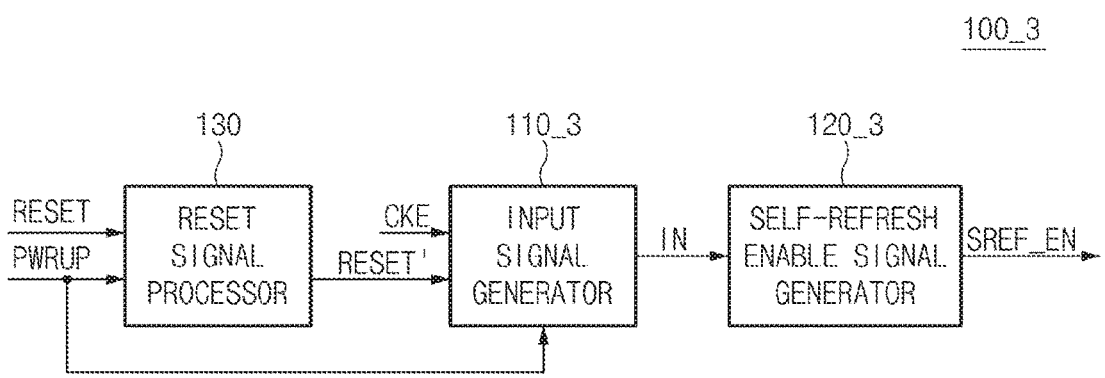
FIG. 8 is a circuit diagram illustrating a representation of an example of a self-refresh controller illustrated in FIG. 1 according to an embodiment of the present disclosure.

Referring to FIG. 8, the self-refresh controller (110_3) according to an embodiment may include an input signal generator (110_3), a self-refresh enable signal generator (120_3), and a reset signal processor 130.

The input signal generator (110_3) may be the input signal generator 110 of FIG. 2 or the input signal generator (110_2) of FIG. 5. Differently from FIG. 2 or FIG. 5, a reset processing signal (RESET') instead of the reset signal (RESET) may be input to the semiconductor devices illustrated in FIGS. 8 to 10, and the remaining structures and functions other than the above-mentioned difference may be identical to those of FIGS. 2 and 5.

The self-refresh enable signal generator (120_3) may be identical to the self-refresh enable signal generator 120 of FIG. 2 or the self-refresh enable signal generator (120_2) of FIG. 5, and as such a detailed description thereof will herein be omitted for convenience of description.

The reset signal processor 130 may receive the reset signal (RESET), and may output only the enabled part located after occurrence of a second enabled part as the reset processing signal (RESET'). The above-mentioned embodiments are distinguished from the first and second embodiments.

For convenience of description and better understanding of the present disclosure, although the reset processing signal (RESET') of these embodiments have the same level as the reset signal (RESET) to be enabled after occurrence of the second reset processing signal, it should be noted that the reset processing signal (RESET') may also have an inversion level.

Figure 9:
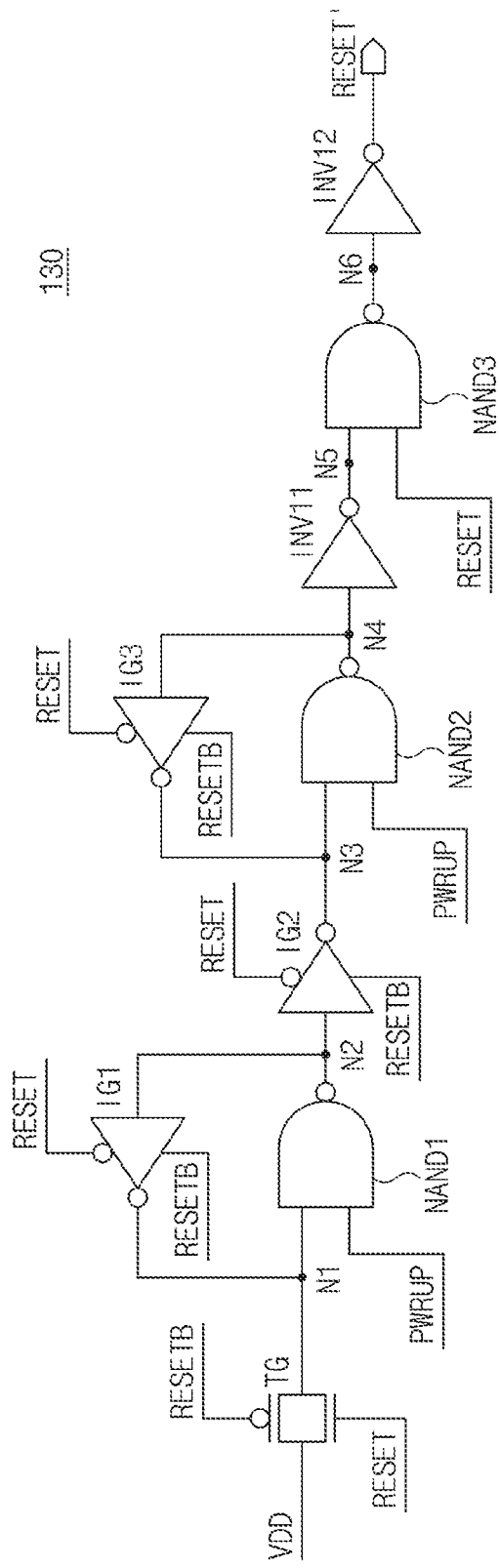
FIG. 9 is a circuit diagram illustrating a representation of an example of a reset signal processor illustrated in FIG. 8 according to an embodiment of the present disclosure.

FIG. 9 is a circuit diagram illustrating a representation of an example of the reset signal processor 130 illustrated in FIG. 8.

Referring to FIG. 9, the reset signal processor 130 may include a transfer gate (TG), NAND operators (NAND1~NAND3), inverter gates (IG1~IG3), and inverters (IVN11~INV12).

The connection relationship of constituent elements contained in the reset signal processor 130 is as follows.

A power-supply voltage VDD is input to the transfer gate TG, and an output terminal of the transfer gate TG is coupled to a node N1. If the reset signal RESET is enabled to a high level, the transfer gate TG is turned on. If the reset signal RESET is disabled to a low level, the transfer gate TG is turned off.

The NAND operator (NAND1) may be interposed between the node N1 and the other node N2. An output signal of the transfer gate TG and the power-up signal (PWRUP) may be input to the NAND operator (NAND1). A feedback output of the inverter gate (IG1) may be coupled to the NAND operator (NAND1). If the reset signal (RESET) is disabled to a low level, the inverter gate (IG1) is turned on. If the reset signal (RESET) is enabled to a high level, the inverter gate (IG1) is turned off.

The inverter gate (IG2) may be interposed between the node N2 and the other node N3. If the reset signal (RESET) is disabled to a low level, the inverter gate (IG2) is turned on. If the reset signal (RESET) is enabled to a high level, the inverter gate (IG2) is turned off.

The NAND operator (NAND2) may be interposed between the node N3 and the node N4. The output signal of the inverter gate (IG2) and the power-up signal (PWRUP) may be input to the NAND operator (NAND2). A feedback output of the inverter gate (IG3) may be coupled to the NAND operator (NAND2). If the reset signal (RESET) is enabled to a high level, the inverter gate (IG3) is turned on. If the rest signal (RESET) is disabled to a low level, the inverter gate (IG3) is turned off.

The inverter (INV11) may be interposed between the node N4 and the other node N5.

The NAND operator (NAND3) may be interposed between the node N5 and the other node N6. The output signal of the inverter INV11 and the reset signal (RESET) may be input to the NAND operator (NAND3).

The output signal of the NAND operator (NAND3) may be input to the inverter (INV12) at the node N6.

The output signal of the inverter (INV12) may be used as the reset processing signal (RESET').

The operation of the reset signal processor 130 will hereinafter be described.

Values of the respective nodes in an initial state before the power-up signal (PWRUP) and the reset signal (RESET) are enabled will hereinafter be described.

Since the reset signal (RESET) has a low-level value, the transfer gate (TG) is turned off. The low-level power-up signal (PWRUP) is input to the NAND operator (NAND1), such that the output signal of the NAND operator (NAND1) is at a high level at the node N2. In this case, since the reset signal (RESET) is at a low level, the inverter gate (IG1) is turned on, such that the output signal of the inverter gate (IG1) is at a low level at the node N1.

Since the reset signal (RESET) is at a low level, the inverter gate (IG2) is turned on. Therefore, the output signal of the inverter gate (IG2) is at a low level at the node N3. Since the reset signal (RESET) is at a low level, the inverter gate (IG3) is turned off. A low-level power-up signal (PWRUP) and a low-level signal of the node 3 (N3) are input to the NAND operator (NAND2), such that the output signal of the NAND operator (NAND2) is at a high level at the node 4 (N4). The output signal of the node N5 is a low-level signal obtained when the output signal of the node N4 is inverted.

Since the low-level reset signal (RESET) and the low-level signal of the node N5 are input to the NAND operator (NAND3), the output signal of the NAND operator (NAND3) is at a high level at the node N6. Therefore, the reset processing signal (RESET') is a low-level signal obtained when the output signal of the node N6 is inverted.

In the above initial state, when the power-up signal (PWRUP) is enabled to a high level and the reset signal is enabled, values of the respective nodes are as follows.

Since the reset signal (RESET) is at a low level, the inverter gate (IG2) is turned off. Since the reset signal (RESET) is at a low level, the inverter gate (IG3) is turned on. Since the output signal of the node N4 is at a high level in the initial state, the output signal of the inverter gate (IG3) is at a low level at the node N3.

The output signal of the node N5 is a low-level signal obtained when the output signal of the node N4 is inverted. Since a high-level reset signal (RESET) and a low-level signal of the node N5 are input to the NAND operator (NAND3), the output signal of the NAND operator (NAND3) is at a high level at the node N6. Accordingly, the reset processing signal (RESET') is a low-level signal obtained when the output signal of the node N6 is inverted.

That is, if the reset signal (RESET) is initially enabled to a high level on the condition that the power-up signal (PWRUP) and the reset signal (RESET) are disabled to a low level, the reset signal processor 130 of FIG. 9 is not enabled to a high level, and remains low in level.

Figure 10:
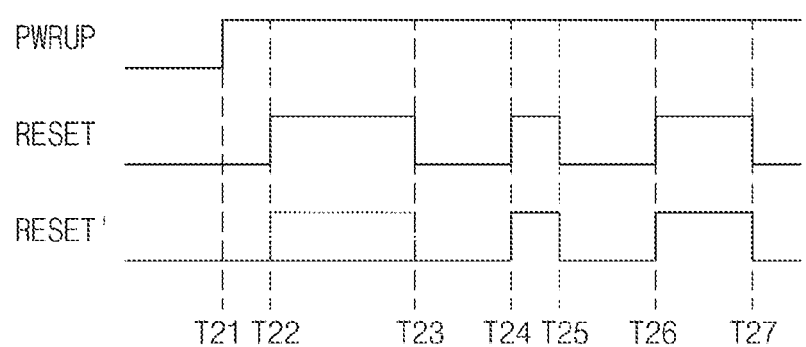
FIG. 10 is a timing diagram illustrating a representation of an example of respective signals of the reset signal processor illustrated in FIG. 8.

FIG. 10 is a timing diagram illustrating a representation of an example of respective signals of the reset signal processor 130 illustrated in FIG. 8.

Referring to FIG. 10, the power-up signal (PWRUP) may be enabled to a high level at a time point T21. Thereafter, the reset signal (RESET) may be enabled to a high level during a time section (T22~T23), a time section (T24~T25), and/or a time section (T26~T27).

In accordance with these embodiments, during the time section (T22—T23) in which the reset signal (RESET) is initially enabled after the power-up signal (PWRUP) is enabled, the reset processing signal (RESET') is not enabled. In accordance with these embodiments, during the time section (T22—T23) in which the reset signal (RESET) is initially enabled after the power-up signal (PWRUP) is enabled, the reset processing signal (RESET') is kept disabled and prevented from being enabled.

A voltage having a predetermined value may be sequentially supplied to a semiconductor device such as DRAM, and this operation is referred to as a ramp-up sequence. In this case, the internal value of the semiconductor device may be initialized by the reset signal (RESET) initially enabled after the power-up signal (PWRUP) is applied to the semiconductor device.

If the self-refresh operation is mandatorily performed even when the reset signal (RESET) is applied to the semiconductor device, the initial value is inappropriately established, resulting in a malfunction or faulty operation of the semiconductor device. Therefore, the reset processing signal (RESET') from which a time section initially enabled after the power-up signal (PWRUP) is enabled is removed is generated, such that the reset processing signal (RESET') instead of the reset signal is used. As a result, the reset processing signal (RESET') is not enabled during a time section in which the reset processing signal (RESET') is initially enabled after the power-up signal (PWRUP) is enabled (i.e., indicated by the dotted horizontal line between T22 and T23), such that a malfunction or faulty operation of the semiconductor device can be prevented.

Figure 11:
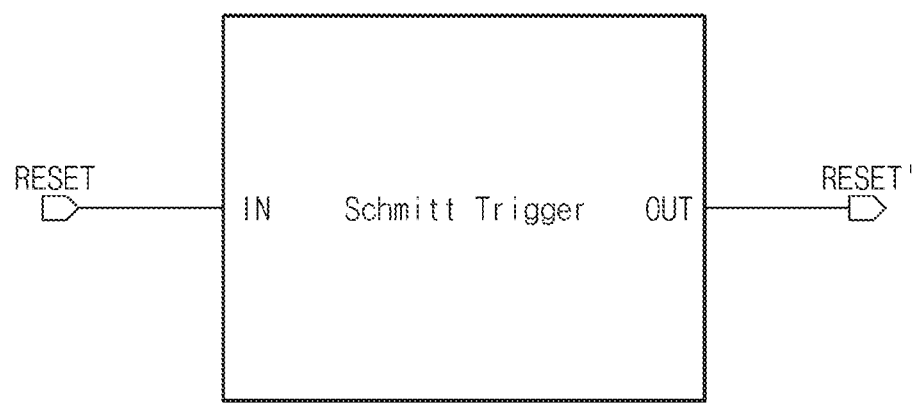
FIG. 11 is a circuit diagram illustrating a representation of an example of a reset signal processor illustrated in FIG. 8 according to an embodiment of the present disclosure.

FIG. 11 is a circuit diagram illustrating a representation of an example of the reset signal processor 130_1 illustrated in FIG. 8 according to an embodiment of the present disclosure.

Referring to FIG. 11, the reset signal processor 130_1 may be comprised of a Schmitt trigger circuit. As a result, if the enable section of the reset signal RESET is shorter than a specific length, this reset signal RESET may be removed. Therefore, if the reset signal RESET is unexpectedly formed in a glitch shape and is then input to the semiconductor device, or if the refresh operation is no longer required due to a short period of the enable time section, the reset signal processor 130 may filter out the reset signal RESET.

As is apparent from the above description, the semiconductor device according to an embodiment performs the refresh operation even when a reset signal is enabled, such that it can reduce the loss or damage of data stored in memory cells.

The semiconductor device according to an embodiment performs the refresh operation even when a reset signal is enabled for a predetermined time or longer, such that the number of unnecessary refresh operations can be greatly reduced.

Figure 12:
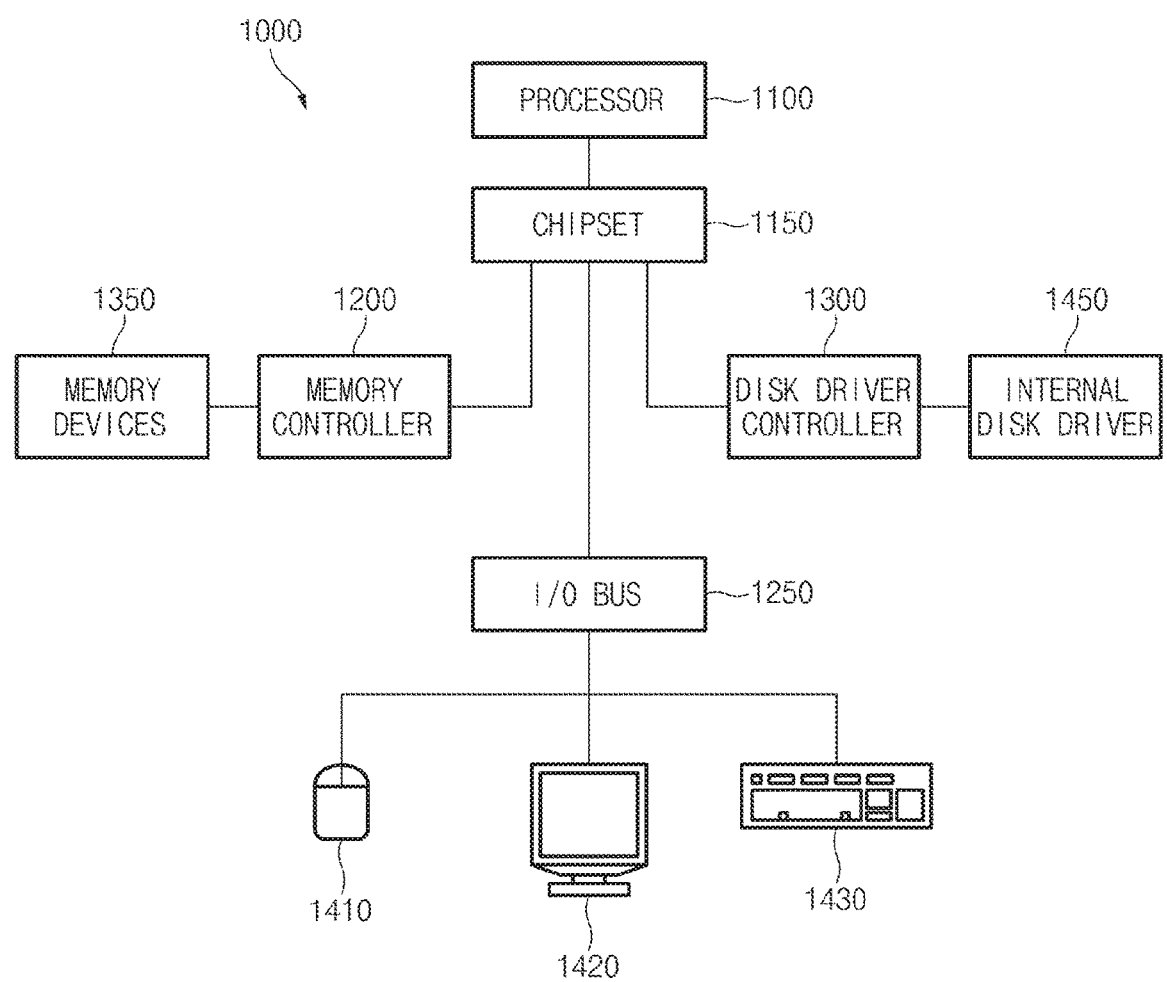
FIG. 12 illustrates a block diagram of an example of a representation of a system employing a semiconductor device with the various embodiments discussed above with relation to FIGS. 1-11.

The semiconductor devices as discussed above (see FIGS. 1-11) are particular useful in the design of other memory devices, processors, and computer systems. For example, referring to FIG. 12, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-11. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-11, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 12 is merely one example of a semiconductor device as discussed above with relation to FIGS. 1-11. In alternate embodiments, such as, for example but not limited to, cellular phones or digital cameras, the components may differ from the embodiments illustrated in FIG. 12.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments consistent with the description have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   an input signal generator configured to enable an input signal when a clock enable signal is enabled and to maintain the enabled state of the input signal when a reset signal transitions from a disabled state to an enabled state while the clock enable signal is enabled; and
   a self-refresh enable signal generator configured to generate a self-refresh enable signal based on the input signal.

2. The semiconductor device according to claim 1, wherein:
   the clock enable signal is a logic low enable signal;
   the reset signal is a logic high enable signal; and
   the input signal generator is configured to generate the input signal by performing an OR or NOR operation between an inversion signal of the clock enable signal and the reset signal.

3. The semiconductor device according to claim 1, wherein:
   the clock enable signal is a logic high enable signal;
   the reset signal is enabled to a high level; and
   the input signal generator is configured to generate the input signal by performing an OR or NOR operation between the clock enable signal and the reset signal.

4. The semiconductor device according to claim 1, wherein if the clock enable signal is enabled even though the reset signal is enabled, the self-refresh enable signal remains enabled.

5. The semiconductor device according to claim 1, further comprising:

a self-refresh pulse generator configured to generate a self-refresh pulse based on the self-refresh enable signal.

6. The semiconductor device according to claim 5, further comprising:
a memory cell in which a self-refresh operation is performed based on the self-refresh pulse.

7. A semiconductor device comprising:
an input signal generator configured to enable an input signal based on an enabled duration of a reset signal being a predetermined time or longer; and
a self-refresh enable signal generator configured to generate a self-refresh enable signal based on the input signal.

8. The semiconductor device according to claim 7, wherein the input signal generator includes:
a reset buffer configured to buffer the reset signal;
a reset length decision circuit configured to determine whether an enable section of the reset signal stored in the reset buffer is equal to or longer than the predetermined time; and
a signal generator configured to enable the input signal based on the enable section of the reset signal being equal to or longer than the predetermined time.

9. The semiconductor device according to claim 8, wherein the reset length decision circuit includes:
a counter configured to determine whether the enable section of the reset signal is equal to or longer than the predetermined time.

10. The semiconductor device according to claim 7, wherein:
the input signal generator is configured to enable the input signal when a clock enable signal is disabled.

11. The semiconductor device according to claim 7, wherein:
the input signal generator is configured to enable the input signal irrespective of the clock enable signal.

12. The semiconductor device according to claim 7, further comprising:
a reset signal processor configured to generate a reset processing signal not enabled, when the reset signal is initially enabled after a power-up signal is enabled.

13. The semiconductor device according to claim 7, further comprising:
a reset signal processor configured to generate a reset processing signal that is kept disabled and prevented from being enabled, when the reset signal is initially enabled after a power-up signal is enabled.

14. The semiconductor device according to claim 12, wherein:
the reset processing signal has a level corresponding to a level of the reset signal after lapse of a time section in which the reset signal is initially enabled.

15. The semiconductor device according to claim 14, wherein:
the reset processing signal has the same level as the level of the reset signal after lapse of a time section in which the reset signal is initially enabled.

16. The semiconductor device according to claim 12, wherein:
the input signal generator is configured to enable the input signal when the reset processing signal is enabled during a predetermined time or longer.

17. The semiconductor device according to claim 7, further comprising:
a reset signal processor configured to generate a reset processing signal not enabled, when a time section in which the reset signal is enabled is equal to or shorter than a predetermined time.

18. The semiconductor device according to claim 17, wherein:
the reset signal processor includes a Schmitt trigger circuit.

19. The semiconductor device according to claim 7, further comprising:
a self-refresh pulse generator configured to generate a self-refresh pulse for performing a self-refresh operation based on the self-refresh enable signal.

20. The semiconductor device according to claim 7, further comprising:
a memory cell in which a self-refresh operation is performed based on the self-refresh pulse.

* * * * *